(12) United States Patent
Iizawa et al.

(10) Patent No.: US 6,468,593 B1
(45) Date of Patent: Oct. 22, 2002

(54) PLATED NON-CONDUCTIVE PRODUCTS AND PLATING METHOD FOR THE SAME

(75) Inventors: Tsutomu Iizawa, Kanagawa (JP); Takuya Ishida, Kanagawa (JP); Tamotsu Murayama, Osaka (JP); Takayuki Yagi, Osaka (JP)

(73) Assignees: Kanto Kasei Co., Ltd., Yokosuka (JP); Tanabe Chemical Industry Co., Ltd., Osaka (JP)

( * ) Notice: Subject to any disclaimer, the term of this patent is extended or adjusted under 35 U.S.C. 154(b) by 0 days.

(21) Appl. No.: 09/200,658

(22) Filed: Nov. 25, 1998

(30) Foreign Application Priority Data

Nov. 27, 1997  (JP) .............................. 9-326573

(51) Int. Cl.⁷ .............................. B05D 1/18; B05D 1/36; C25D 5/54; C25D 5/56
(52) U.S. Cl. ................. 427/443.1; 427/440; 427/430.1; 427/407.2; 427/408; 427/412; 427/412.1; 427/419.2; 427/419.5; 205/159; 205/160; 205/163; 205/166; 205/167; 205/169
(58) Field of Search ................................ 205/159, 183, 205/187, 924, 928, 160, 163, 167, 169; 428/418, 457, 458, 461–463; 427/443.1, 440, 430.1, 407.2

(56) References Cited

U.S. PATENT DOCUMENTS

| 4,077,853 A | * | 3/1978 | Coll-Palagos ................. 204/20 |
| 4,469,714 A | * | 9/1984 | Wada et al. ................ 427/54.1 |
| 5,085,534 A | * | 2/1992 | Kenichi et al. ................ 401/65 |

* cited by examiner

*Primary Examiner*—Edna Wong
(74) *Attorney, Agent, or Firm*—Benjamin Aaron Adler

(57) ABSTRACT

Provided is a method of plating a non-conductive product comprising the steps of: forming a coating film on a surface of the non-conductive product with a conductive paint having the following composition of solid ingredients: (a) a resin vehicle in 20 to 80 weight %, and (b) a conductive whisker in 80 to 20 weight %; and executing electroless plating on a surface of the coating film. Also provided are products produced by this method.

12 Claims, No Drawings

PLATED NON-CONDUCTIVE PRODUCTS AND PLATING METHOD FOR THE SAME

CROSS REFERENCE TO RELATED APPLICATION

This application claims benefit of Japanese patent application 9-326573, filed Nov. 27, 1997.

BACKGROUND OF THE INVENTION

1. Field of the Invention

The present invention relates generally to the fields of chemical engineering of plated non-conductive products and methods for creating such products. More specifically, the present invention relates to plated non-conductive products used in vehicles, computer-related machines, office equipment or the like and a plating method for the same.

2. Description of the Related Art

Of non-conductive products, for instance, resin products molded by injection molding are generally subjected to surface processing to give glitter and brightness to the surface. For that purpose, a method of depositing metal on a surface of a non-conductive product in a vacuum, a method of sputtering metal, or a method of electroless plating, or the like, have been employed. In some applications, actual needs are satisfied by any of the methods described above, but in other applications, high durability of products is required, and in that case electroplating is also required.

A non-conductive product does not have conductivity, and for plating a non-conductive product, processing is required for converting a surface of the non-conductive product to a conductive one. In this case, at first, a surface of the non-conductive product is cleaned, then etched, subjected to processing such as catalyzing, and further subjected to electroless plating. This processing sequence is quite complicated.

In contrast, a method of applying a conductive paint on a surface of a non-conductive product and then subjecting the product to electroplating has been proposed. The conductive paint is generally produced by dispersing an active and conductive metallic material or a conductive organic material in a composition containing a resin vehicle, an organic solvent, a stabilizer, a dispersant, and a plasticizer or the like; and a coating film formed with the conductive paint can endure severe environmental conditions. However, if resin constituting a molded product to be painted is polypropylene (PP), polybutylene terephthalate (PBT), polyamide (PA), polycarbonate (PC), or the like, paint adheres to the surface weakly, so that there are some restrictions in selection of resin for producing molded products.

To overcome this problem, for improving adhesiveness of resin to a surface of a molded product, the so-called two-coat painting is often carried out in which polymer painting is executed to a molded product and then a conductive paint is applied to the surface. Further, with the conductive paints used currently, the adhesiveness between a conductive coating film as the foundation and a plate layer is weak, and durability of the plate layer is not sufficient. For this reason, there are some restrictions when the product subjected to the processing described above is used in a severe outdoor environment.

The prior art is deficient in the lack of an effective conductive paint for one-coat painting which has no restriction in the performance nor in function thereof, can be applied in a wide range in the field of decorative or functional plating, and also can b e applied to the foundation directly. The present invention fulfills this long-standing need and desire in the art.

SUMMARY OF THE INVENTION

The present invention was made to solve the problem described above. It is an object of the present invention to develop a conductive paint capable of forming a coating film with extremely high adhesiveness to a plate layer and a method of using the same, and to provide products produced by this conductive paint and this method.

The present invention discloses that a coating film formed with a conductive paint with a conductive whisker mixed therein at a prespecified rate has extemely high adhesiveness with a plate layer. Namely the present invention relates to a plating method for non-conductive products in which a coating film is formed in each required portion with a conductive paint containing solid ingredients at the following ratios; (A) resin vehicle: 20–80 weight %; (B) conductive whisker: 80–20 weight % and electroless plating is executed to a surface of the coating film and to plated non-conductive products obtained by the method. The present invention also relates to a method of plating non-conductive products in which additionally electroplating is executed in some applications.

Other and further aspects, features, and advantages of the present invention will be apparent from the following description of the presently preferred embodiments of the invention given for the purpose of disclosure.

DETAILED DESCRIPTION OF THE INVENTION

In this invention, non-conductive products are defined as products having a high electrical resistance and practically used as electrically insulating materials including resin, rubber, wood, glass, and cloth.

The resin vehicle used as an ingredient of a coating film used in the conductive paint according to the present invention is a coating film ingredient which has been used in the conventional types of synthetic resin paints.

Examples of an element for forming a coating film as one of the ingredients of the coating film include polyvinyl chloride, polyvinyl acetate, saturated polyester resin, acrylic resin, vinyl chloride-vinyl acetate copolymer resin, vinyl chloride-vinyl acetate-maleic acid anhydride copolymer resin, vinyl chloride-vinyl acetate-vinyl alcohol copolymer resin, styrene-butadiene copolymer resin, unsaturated polyester resin, alkyd resin, epoxy resin or a mixture thereof; of these, the vinyl chloride-vinyl acetate-maleic acid anhydride copolymer resin and vinyl chloride-vinyl acetate-vinyl alcohol copolymer resin are preferable, and that simultaneously containing the vinyl chloride-vinyl acetate-maleic acid anhydride copolymer resin, vinyl chloride-vinyl acetate-vinyl alcohol copolymer resin, or a saturated or unsaturated polyester resin is especially preferable.

Also as a coating film ingredient, in addition to the coating film forming element as described above, pigment and such an agent as a plasticizer, a dispersant, a hardener, and a stabilizer as a supplementary element for a coating film may be used according to the necessity.

Further various types of organic solvent may be used as a supplementary element for forming a coating film, but solvents for synthetic resin paints conventionally used may be used. The solvents include a solvent based on aliphatic hydrocarbons, a solvent based on aromatic hydrocarbons, a solvent based on alcohol, a solvent based on an ester, a solvent based on a ketone, or a mixture thereof.

The conductive whisker used in the present invention is produced by covering a fibrous or needle-shaped monocrystal of a metal oxide or an inorganic salt with a conductive material. A fibrous or needle-shaped monocrystal is often used. Examples of the fibrous or needle-shaped monocrystal of a metal oxide or an inorganic salt include those of sapphire, silicon carbide, potassium titanate, aluminium borate; potassium titanate and aluminium borate are especially preferable.

The conductive whisker with a fiber diameter in a range from 0.1 to 100 $\mu$m and a fiber length in a range from 0.5 to 200 $\mu$m are preferable, and that with a fiber diameter in a range from 0.3 to 15 $\mu$m and a fiber length in a range from 10 to 20 $\mu$m is especially preferable.

Material such as silver or tin oxide may be used as the conductive material used for covering the whisker. A quantity of the material used for covering the whisker is not specifically restricted so far as conductivity is given to the whisker.

To advantageously achieve the object of the present invention, however, it is preferable that a surface resistance value of conductive whisker is in a range from $10^0$ to $10^{-3}$ $\Omega$/cm (when measured with the Rorester MCP tester from Mitsubishi Yuka K. K). The resin vehicle and conductive whisker can be mixed with each other by solving the resin vehicle in an organic solvent as a supplementary element for forming a coating film and adding the conductive whisker to the solution. The mixing ratio of each component changes according to a type of resin vehicle used in a n application, but generally the resin vehicle is in a range from 20 to 80 weight %, and the conductive whisker is in a range from 80 to 2 0 weight %, and when a percentage of the resin vehicle is less than 20 weight %, the mixture is rather solid and can not easily be handled, and also when a percentage of the resin vehicle is over 80 weight %, the adhesiveness to a plate layer is not sufficient. Preferably a percentage of resin vehicle is in a range from 40 to 60 weight %, and that of the conductive whisker is in a range from 60 to 40 weight %.

Also in the method according to the present invention, a conductive paint shows its effect especially when a coating film is formed directly on a surface of a non-conductive product, but the conductive paint may be applied after a surface of a non-conductive product is subjected to the processing for activating it or for other purpose like in the conventional technology. Adhesiveness of plating executed subsequently can be improved by diluting the conductive paint in an organic solvent, then spraying the solvent containing the conductive paint for coating, and finally drying the coating film. In this case, a thickness of the dried coating film is preferably in a range from 1 to 100 $\mu$m, and more preferably in a range from 5 to 25 $\mu$m. It is preferable to dry the product at room temperature for 2 to 15 minutes and then to maintain the product at a temperature from 70° C. to 90° C. for 10 to 60 minutes. In this step, a diameter of each microvoid formed due to the conductive whisker mixed therein advantageously expands because of gasification of a solvent in the coating film or for some other reasons, and adhesiveness of the plate layer increases.

The adhesiveness with a plate layer is remarkably improved especially when a paint produced by blending whisker with an aspect ratio in a range from 10 to 20 and a fiber length of 5 $\mu$m or less with a filler for resin vehicle at a blending ratio of 50 to 60 weight %. This mixture is kneaded together with polyisocyanate as a hardening component and a diluent with the viscosity adjusted to 10 seconds with the Ford Cap (FC) #4 (25° C.). The mixture is sprayed with a spray gun with a nozzle bore diameter of 1 mm at a spraying pressure of 3 kgf/cm$^2$ so that the dry film thickness will b e 10 $\mu$m, left for 10 minutes after setting, dried for 30 minutes under a temperature of 85° C. to form a coating film so that micro-voids with a diameter of 3 to 5 $\mu$m and a depth of 3 to 5 $\mu$m are formed.

In the plating method according to the present invention, it is preferable that a conductive paint is applied to a surface of a non-conductive product, and then the surface is defatted and at the same time activated, and finally electroless plating is executed to the surface with electroplating additionally executed, if necessary.

Various types of metal can be used for electroless plating executed after defatting and activating, but nickel or copper is especially preferable. Also examples of metal used for electroplating executed on the electroless-plated layer include copper, nickel, chrome, tin-nickel alloy, or gold.

When a conductive paint is applied only to sections to be electroplated and then electroplating is executed to the sections, the decorative effect by plating can be improved.

There is no specific restriction over resin constituting a molded product to be processed by the method according to the present invention. Generally the method according to the present invention can be applied to non-conductive products used in vehicles, computer-related apparatuses, and office equipment.

The following examples are given for the purpose of illustrating various embodiments of the invention and are not meant to limit the present invention in any fashion. It should be noted that the term of "portion" in the following embodiment indicates a "weight portion".

EXAMPLE 1
Preparation of a Conductive Paint

A vinyl chloride-vinyl acetate-maleic acid anhydride copolymer resin (produced by Union Carbide Ccrp., vinylight VMCH), a vinyl chloride-vinyl acetate-vinyl alcohol copolymer resin (produced by Union Carbide CorD., Vinylight VAGH), and unsaturated polyester resin (produced by Huls Corp., RESIN LTW) were solved in an organic solvent (a mixture of toluene, methoxypropyl acetate and methylethyl ketone), and then a plasticizer (produced by Rohm & Haas Corp., Paraplex G-62), reforming resin (produced by Hoechst Corp., U resin B), a stabilizer (produced by Yuka-Shell Corp., EP 834}, a light-proof agent (produced by Sum Chemical Corp., UV 5411), a dispersant (Big-Chemy Corp., BYK-I01), a sedimentation preventing agent (Nippon Aerosil Corp., Aerosil 81Z, Bentone) was solved in the solvent.

Subsequently, potassium titanate whisker (produced by Otsuka-Kagaku Corp., Dentole SD-100) and aluminum borate whisker (produced by Mitsui Kinzoku K.K., Bastran 5110) were mixed and dispersed in the solvent, and the solution was subjected to compulsory dispersion for 1 to 2 hours with a Centry-Mill distributor to prepare a conductive paint. The resultant conductive paint was diluted with an organic solvent thinner (a mixture of toluene, xylene, methylisobutyl keton and ethyl acetate) (100 weight portions of paint: 50 weight portions of thinner), the diluted paint was sprayed on a panel formed with nylon resin so that the dry film thickness would be in a range from 10 to 25 $\mu$m, the panel was left for 3 to 10 minutes at a room temperature and then dried for 10 to 30 minutes at a temperature of 80° C. The coating film obtained was tested for assessment. The results as shown in Table 1.

TABLE 1

|  | Weight Portion | |
|---|---|---|
|  | Ex. 1 | Ex. 2 |
| Vinyl choloride - vinyl acetate - maleic acid anhydride copolymer resin | 3.3 | 3.3 |
| Vinyl choloride - vinyl acetate - vinyl alcohol copolymer risin | 3.3 | 3.3 |
| Unsaturated polyester resin | 4.5 | 4.5 |
| Plasticizer (Paraplex G-62) | 1.0 | 1.0 |
| Reforming resin (U-resin B) | 1.0 | 1.0 |
| Stabilizer (EP834) | 0.6 | 0.6 |
| Light-stabilizer (UV 5411) | 1.0 | 1.0 |
| Dispersant (BYK-101) | 0.5 | 0.5 |
| Sedimentation preventing agent (Aerosil 812, Bentone) | 1.0 | 1.0 |
| Solvent | 70.0 | 70.0 |
| Potassium titanate whisker | 3.8 | 3.8 |
| Potassium borate whisker | 10.0 | 10.0 |
| hexamethylene di-isocyanate | — | 1.5 |
| Toluene | — | 1.5 |
| Ethyl acetate | — | 2.0 |

EXAMPLE 2

5 weight portions of a solution obtained by hrexamethylene di-isocxanate prepolymer (produced by Sumitomo Bayer Corp., Desmodule N75) in a solvent comprising a mixture of toluene and ethyl acetate mixture by 30 weight % as a hardner element was added to 100 weight portions of the main ingredients according to the composition shown in Table 1. Further, a composition was obtained by mixing an organic solvent thinner b y 50 weight % into the mixture above and was coated so that a coating film with the thickness from 10 to 25 μm would be formed on a nylon resin panel. This panel was subjected to the processing described in Example 1, and then was tested for assessment. The result is as shown in Table 4.

EXAMPLE 3

According to the composition shown in Table 2, potassium titanate whisker (produced by Otsuka Kagaku KK, Super Dentole SD-100) and potassium borate whisker (produced by Mitsui Kinzoku K.K, Bastran 5110 Y) were dispersed and mixed in a clear solution prepared by adding epoxy resin (Yuka-Epoxy Jushi Corp., EP 834) and a magnesium aluminum based composition (produced by Akishima Kagaku K.K., TS 380) each as a stabilizer were to denatured chloride olefin-based varnish (produced by Dai-Nihon Inki Corp., AC-P300-25) and additionally adding a polyacrylate polymer (produced by Efuka Corp., EFK-400) as a dispersant, the clear solution mixed and solved in an organic solvent, and the mixture was compulsorily dispersed for 1 to 2 hours with a Centry-Mill distributor to prepare a conductive paint.

The resultant conductive paint was diluted with a n organic solvent thinner (a mixture of toluene, xylene, metylisobutyl ketone and ethyl acetate) (100 weight portions of paints: 50 weight portions of thinner). The diluted paint was sprayed on a PP resin panel so that the dry film thickness would be in a range from 10 to 25 μm. The panel was left for 5 to 10 minutes under the room temperature, dried for 10 to 30 minutes at a temperature of 80° C., and the coating film was tested. The result is shown in Table 4.

TABLE 2

|  | (WEIGHT PROPORTION) Ex. 3 |
|---|---|
| Acryl resin denatured chloride polyolefin resin varnish | 35.0 |
| Stabilizer EP 834 | 1.0 |
| Stabilizer 880 | 1.0 |
| Dispersant EFK - 400 | 1.0 |
| Solvent: Toluene, metylisobutyl ketone Swasor 1500, isobutanol | 46.0 |
| Aluminum borate whisker (astran 5110) | 12.0 |
| Potassium borate whisker (Super Dentole SD-100) | 4.0 |

COMPARATIVE EXAMPLE 1–3

According to the composition shown in Table 3, the paint compositions were prepared according to the same procedure as that in Example 1. The obtained paint compositions were applied like in Example 3 onto a PP resin panel and were tested for assessment. The result is shown in Table 4.

TABLE 3

|  | (WEIGHT PORTION) Comparative example | | |
|---|---|---|---|
|  | 1 | 2 | 3 |
| vinyl chloride - vinyl acetate - maleic acid anhydride copolymer resin | 3.3 | 3.3 | 3.3 |
| Vinyl chloride - vinyl acetate - Vinyl alcohol copolymer resin | 3.3 | 3.3 | 3.3 |
| Plasticizer (Paraplex G-62) | 1.0 | 1.0 | 1.0 |
| Reforming resin (U resin) | 1.0 | 1.0 | 1.0 |
| Stabilizer (EP834) | 0.6 | 0.6 | 0.6 |
| Light-stabilizer (UV5411) | 1.0 | 1.0 | 1.0 |
| Dispersant (BYK-101) | 0.5 | 0.5 | 1.0 |
| Sedimentation preventing agent A | 0.5 | 0.5 | 1.0 |
| Sedimentation preventing agent B | 0.5 | 0.5 | 1.0 |
| Solvent | 72.3 | 75.8 | 61.8 |
| Potassium titanate whisker | 3.0 | 3.0 | — |
| Aluminium borate whisker | 3.0 | 8.0 | 1.0 |
| conductive carbon | — | 1.5 | — |
| Conductive metal powder A (Ni) | 10.0 | — | — |
| Conductive metal powder B (Cu) | — | — | 5.0 |
| Acryl resin A | — | — | 5.0 |
| Acryl resin B | — | — | 5.0 |

TABLE 4

|  | Example | | | Comparative example | | |
|---|---|---|---|---|---|---|
|  | 1 | 2 | 3 | 1 | 2 | 3 |
| Surface resistance value KΩ cm | 300 | 17 | 18 | 300 | 3 | 12 |
| Adhesiveness with substrate |  |  |  |  |  |  |
| A: ABS | G | G | — | G | G | G |
| B: Nylon | G | G | — | G | G | G |
| C: PC | G | G | — | G | G | G |
| D: PP | — | — | G | — | — | — |
| Adhesiveness with plate kgf/cm | ≧1 | ≧1 | ≧1 | 0.1 | 0.1 | 0.1 |
| Quality of coating film |  |  |  |  |  |  |
| Appearance | G | G | G | G | G | G |
| Humidity resist. | G | G | G | G | NG | NG |
| Water resistance | G | G | G | G | NG | NG |

TABLE 4-continued

|  | Example | | | Comparative example | | |
| --- | --- | --- | --- | --- | --- | --- |
|  | 1 | 2 | 3 | 1 | 2 | 3 |
| Heat resistance | G | G | G | NG | NG | NG |
| Impact resistance | G | G | G | NG | NG | NG |

G: Good
NG: Not good

EXAMPLE 3
Plating of ABC Non-conductive Products

The conductive paint prepared in Example 1 was applied to a grill made from an ABS non-conductive product and was dried like in Example 1. Then a surface of the conductive paint coating film was defatted, activated, subjected to electroless nickel plating, copper electroplating, and then nickel electroplating. Finally, chrome plating was executed to the product. Adhesiveness of the plate layer measured according to JIS H 8630 was 1 kgf/cm or more.

EXAMPLE 4
Plating of PP Non-conductive Products

The conductive paint prepared in Example 3 was applied to a bumper of a PP non-conductive product and was dried like in Example 3. A surface of the conductive paint coating film was defatted and. activated, and then subjected to copper electroplating, and nickel electroplating. Finally, chrome plating was executed to the top layer. The adhesiveness was 1 kgf/cm or more.

EXAMPLE 5
Plating of PA Non-conductive Products

The conductive paint prepared in Example 1 was applied to a wheel cap of a PA non-conductive product and dried like in Example 1. A surface of the conductive pain coating film was defatted and activated, and then subjected to electroless plating with nickel, and copper electroplating and nickel electroplating, and finally chrome plating was executed to the top layer. The adhesiveness was 1 kgf/cm or more.

EXAMPLE 6
Plating of PBT Non-conductive Products

The conductive paint prepared in Example 1 was applied to a guide bar of OA equipment based a PBT non-conductive product and was dried like in Example 1. Then a surface of the conductive paint coating film was defatted and activated, and then subjected to electroless plating with nickel, and then to copper electroplating and nickel electroplating, and finally chrome plating was executed to the top layer. The adhesiveness was 1 kgf/cm or more.

EXAMPLE 7
Plating of ABS/ PC Non-conductive Product

The conductive paint prepared in Example 1 was applied to a panel for audio equipment based on an ABS/PC non-conductive product and was dried like in Example 1. The surface of the conductive paint coating film was defatted and activated, and subjected to electroless plating with nickel, and then to copper electroplating and nickel electroplating, and finally chrome plating was executed to the top layer. The adhesiveness was 1 kgf/cm or more.

EXAMPLE 8

The conductive paint prepared in Example 1 was applied only to necessary portions of a design drawn on the non-conductive products in Examples 3 to 8 and was dried as in Example 1. The surface of the conductive paint coating film was defatted and activated, subjected to electroless plating with nickel, and then to copper electroplating and nickel electroplating, and finally chrome plating was executed to the top layer to form a partial plate.

EXAMPLE 9

The conductive paint prepared in Example 1 was applied to a housing of electronic equipment based on ABS, PA, ABSIPC, PC, PBT non-conductive products each requiring high adhesiveness, and was. dried like in Example 1. A surface of the conductive paint coating film was defatted and activated, and then subjected to electroless plating with copper, and then to electroless plating with nickel. As a result it was possible to give the shielding capability against electromagnetic waves to the electronic equipment with a coating film ensuring the adhesiveness of 1 kgf/cm, or more which could not be realized with the conventional technology. Adhesiveness of each plate layer is shown in Table 5.

TABLE 5

|  | kgf/cm) | | | |
| --- | --- | --- | --- | --- |
| Non-conductive product | ABS | PA | ABS/PC | PBT |
| Conventional technology | ≦0.1 | ≦0.1 | ≦0.1 | ≦0.1 |
| Present invention | ≧1.0 | ≧1.0 | ≧1.0 | ≧1.0 |

EXAMPLE 10

The conductive paint prepared in Example 3 was applied to a housing of electronic equipment based on a PP non-conductive product and requiring high adhesiveness. A surface of the conductive paint coating film was defatted and activated, subjected to electroless plating with copper, and then to electroless plating with nickel. As a result it was possible to give the shielding capability against electromagnetic waves to the electronic equipment, with a plated coating film with the adhesiveness of 1 kgf/cm or more which could never be realized in the conventional technology Adhesiveness of the plate layer is as shown in Table 6.

TABLE 6

| Non-conductive product | PP |
| --- | --- |
| Prior art (kfg/cm) | ≦0.1 |
| Present invention (kfg/cm) | ≧1.0 |

EXAMPLE 11

The conductive paint prepared in Example 1 was applied to a guide or a gear of electronic equipment based on ABS, PA, ABS/PC, PC, PBT non-conductive products, and was dried. A surface. of the conductive coating film was defatted and activated, and subjected to electroless plating with nickel or electroless composite plating, and as a result it was possible to improve the abrasion resistance or corrosion resistance.

EXAMPLE 12

The conductive paint prepared in Example 3 was applied to a guide or a gear of electronic equipment based on PP non-conductive products, and was dried. A surface of the conductive paint coating film was defatted and activated, and subjected to electroless plating with nickel or electroless composite plating, and as a result it was possible to improve the abrasion resistance or corrosion resistance.

EXAMPLE 13

100 weight portions of the main ingredients used in Example 1, and 0.8 weight portions of hexametylene di-isocyanate as a hardening component were solved and diluted in 100 weight portions of a mixture of toluene, butyl acetate, methoxypropyl acetate, and Awazor 1500 as a diluent. The resultant diluted paint was sprayed with a spray gun with a nozzle diameter of 1 mm under the following conditions: pressure of 3 kgf/cm$^2$, a discharge rate of 1 to 3 rotations, a pattern width of 1 to fully opened, and a gun range from 20 to 25 cm, and was left for 10 minutes after setting, dried for 30 minutes under the temperature from 70 to 90° C. to obtain a coating film with a dry film thickness of 10 µm. It was found out as a result of examination that a number of microvoids each with a diameter from 3 to 5 µm and a depth from 3 to 5 µm had been formed in this coating film. Metal plating was executed on this coating film like in Example 3, and adhesiveness of the plate layer was measured, and the adhesiveness was 1 kgf/cm$^2$ or more.

With the plated non-conductive products and the plating method according to the present invention, it was possible to form a plate layer having extremely high adhesiveness on a surface of the non-conductive products, so that the present invention is quite useful in decoration of non-conductive products used in vehicles, computer-related machines, office equipment or the like and in the field of functional plating.

Thus, the present invention is directed to a method of plating a non-conductive product comprising the steps of: forming a coating film on a surface of a non-conductive product with a conductive paint having the following composition of solid ingredients: (a) a resin vehicle in 20 to 80 weight %, and (b) a conductive whisker in 80 to 20 weight %; and executing electroless plating on a surface of the coating film. In a separate embodiment of the present invention, this method further comprises the step of executing electroplating to the surface of the coating film.

In the method of the present invention, the electroless plating is executed preferably with a metal selected from the group consisting of nickel and copper. Preferably, the conductive whisker is selected from the group consisting of a fibrous monocrystal of a metal, a metal oxide, and an inorganic salt or selected from the group consisting of a needle-shaped monocrystal of a metal, and metal oxide, or an inorganic salt. In one embodiment, the conductive whisker is covered with a conductive material. More preferably, the conductive whisker is selected from the group consisting of sapphire, silicon carbide, potassium titanate and aluminum borate. Generally, the conductive whisker has a fiber diameter of from about 0.1 µm to about 100 µm, a fiber length of from about 0.5 µm to 200 µm, and a surface resistance value of from about 10° to 10$^{-3}$ Ω/cm.

The resin vehicle useful in the methods of the present invention is preferably in a range from 40 to 60 weight %, and said conductive whisker is in a range from 60 to 40 weight %. Representative compound comprising the resin vehicle are at least one of the following: polyvinyl chloride, polyvinyl acetate, saturated polyester resin, acrylic resin, vinyl chloride-vinyl acetate copolymer resin, vinyl chloride-vinyl acetate-maleic acid anhydride copolymer resin, vinyl chloride-vinyl acetate-vinyl alcohol copolymer resin, styrene-butadiene copolymer resin, unsaturated polyester resin, alkyd resin, and epoxy resin. Preferably, the resin vehicle simultaneously contains vinyl chloride-vinyl acetate-malaic acid anhydride copolymer resin, vinyl chloride-vinyl acetate-vinyl alcohol copolymer resin, or a saturated or unsaturated polyester resin.

The present invention is also directed to an embodiment of the method described above, further comprising the step of: adjusting viscosity of the conductive paint so as to improve adhesiveness of said electroless plating layer; forming microvoids in a surface of a coating film after painting by painting and drying; and executing electroless plating on a surface of the coating film so that said microvoids have a diameter of from about 0.1 µm to about 50 µm. The present invention is also directed to non-conductive product produced by the method of the present invention.

One skilled in the art will readily appreciate that the present invention is well adapted to carry out the objects and obtain the ends and advantages mentioned, as well as those inherent therein. The present examples along with the methods, molecules, and specific compounds described herein are presently representative of preferred embodiments, are exemplary, and are not intended as limitations on the scope of the invention. Changes therein and other uses will occur to those skilled in the art which are encompassed within the spirit of the invention as defined by the scope of the claims.

What is claimed is:

1. A method of plating a non-conductive product comprising the steps of:
   (a) forming a coating film on necessary portions of a surface of a non-conductive product with a conductive paint having the following composition of solid ingredients: (a) a resin vehicle in 20 to 80 weight %, and (b) a conductive whisker in 80 to 20 weight % by:
      (i) adjusting viscosity of the conductive paint with an organic solvent
      (ii) painting the conductive paint containing the conductive whisker onto the surface of the non-conductive product;
      (iii) drying the painted conductive paint at room temperature to form a dried coating film; and
      (iv) maintaining the dried coating film at a temperature from about 70° C. to about 90° C. wherein such temperature gasifies the solvent around the conductive whisker in the coating film thereby forming microvoids having a diameter of about 0.1 µm to about 50 µm on the surface of the coating film such that the microvoids improve adhesiveness of a subsequently plated electroless plating layer; and
   (b) executing electroless plating on the surface of the coating film thereby plating the non-conductive product.

2. The method of claim 1, further comprising the step of: executing electroplating on the electroless plating.

3. The method of claim 1, wherein the electroless plating is executed with a metal selected from the group consisting of nickel and copper.

4. The method of claim 1, wherein said resin vehicle is in a range of from 40 to 60 weight %, and said conductive whisker is in a range of from 60 to 40 weight %.

5. The method of claim 1, wherein said conductive whisker has a fiber diameter of from about 0.1 µm to about 100 µm, a fiber length of from about 0.5 µm to 200 µm, and a surface resistance value of from about 10° to 10$^{-3}$ Ω/cm.

6. The method of claim 1, wherein said resin vehicle contains at least one compound selected from the group consisting of polyvinyl chloride, polyvinyl acetate, saturated polyester resin, acrylic resin, vinyl chloride-vinyl acetate copolymer resin, vinyl chloride-vinyl acetate-maleic acid anhydride copolymer resin, vinyl chloride-vinyl acetate-vinyl alcohol copolymer resin, styrene-butadiene copolymer resin, unsaturated polyester resin, alky resin, and epoxy resin.

7. The method of claim 6, wherein said resin vehicle further contains vinyl chloride-vinyl acetate-malaic acid anhydride copolymer resin, vinyl chloride-vinyl acetate-vinyl alcohol copolymer resin, or a saturated or unsaturated polyester resin.

8. A method of claim 1, wherein said non-conductive product is selected from the group consisting of resin, rubber, ceramics, wood, glass and cloth.

9. The method of claim 1, wherein the conductive whisker is selected from group consisting of a fibrous monocrystal of a metal, a fibrous monocrystal of a metal oxide, or a fibrous monocrystal of an inorganic salt; and a needle-shaped monocrystal of a metal, a needle-shaped monocrystal of a metal oxide, or a needle-shaped monocrystal of an inorganic salt.

10. The method of claim 9 wherein the fibrous monocrystal of a metal oxide, the fibrous monocrystal of an inorganic salt, the needle-shaped monocrystal of a metal oxide or the needle-shaped monocrystal of an inorganic salt is covered with a conductive material.

11. The method of claim 9 wherein said metal oxide is selected from the group consisting of sapphire, potassium titanate and aluminum borate.

12. The method of claim 9 wherein said inorganic salt is silicon carbide.

* * * * *